(12) United States Patent
Sprague et al.

(10) Patent No.: US 6,567,337 B1
(45) Date of Patent: May 20, 2003

(54) PULSED CIRCUIT TOPOLOGY TO PERFORM A MEMORY ARRAY WRITE OPERATION

(75) Inventors: Milo D. Sprague, Hudson, MA (US); David K. Li, Portland, OR (US); Robert J. Murray, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/607,897

(22) Filed: Jun. 30, 2000

(51) Int. Cl.$^7$ .................................................. G11C 8/00
(52) U.S. Cl. ............. 365/233; 365/189.05; 365/189.12
(58) Field of Search ........................... 365/233, 189.01, 365/189.05, 189.12

(56) References Cited

U.S. PATENT DOCUMENTS

| | | | |
|---|---|---|---|
| 5,226,011 A | * | 7/1993 | Yanagisawa ............ 365/189.05 |
| 5,453,708 A | | 9/1995 | Gupta et al. |
| 5,467,037 A | | 11/1995 | Kumar et al. |
| 5,491,442 A | | 2/1996 | Mirov et al. |
| 5,517,136 A | | 5/1996 | Harris et al. |
| 5,535,343 A | * | 7/1996 | Verseput ..................... 395/308 |
| 5,708,374 A | | 1/1998 | Durham et al. |
| 5,721,875 A | | 2/1998 | Fletcher |
| 5,764,084 A | | 6/1998 | Lev |
| 5,796,282 A | | 8/1998 | Sprague et al. |
| 5,828,234 A | | 10/1998 | Sprague |
| 5,831,932 A | * | 11/1998 | Merritt et al. ............ 365/233.5 |
| 5,880,608 A | | 3/1999 | Mehta et al. |
| 5,892,372 A | | 4/1999 | Ciraula et al. |
| 5,942,917 A | | 8/1999 | Chappell et al. |
| 5,952,859 A | | 9/1999 | Kim et al. |
| 5,973,514 A | | 10/1999 | Kuo et al. |
| 5,986,475 A | | 11/1999 | Kim et al. |
| 6,011,410 A | | 1/2000 | Kim et al. |
| 6,023,182 A | * | 2/2000 | Milshtein et al. ........... 327/299 |
| 6,040,716 A | | 3/2000 | Bosshart |
| 6,094,071 A | | 7/2000 | Ciraula et al. |
| 6,172,530 B1 | | 1/2001 | Bull et al. |
| 6,201,415 B1 | | 3/2001 | Manglore |
| 6,201,431 B1 | | 3/2001 | Allen et al. |
| 6,204,714 B1 | | 3/2001 | Milshtein et al. |
| 6,239,621 B1 | | 5/2001 | Milshtein et al. |
| 6,242,958 B1 | | 6/2001 | Fletcher |
| 6,275,069 B1 | | 8/2001 | Chung et al. |
| 6,320,441 B1 | | 11/2001 | Fletcher et al. |
| 6,331,793 B1 | | 12/2001 | Fletcher et al. |

FOREIGN PATENT DOCUMENTS

WO          WO 98/29949          9/1998

OTHER PUBLICATIONS

Alisa Scherer et al., An Out–of Order Three–Way Superscalar Multimedia Floating–Point Unit 1999, pp. 94–95,449, Advanced Micro Devices, Sunnyvale, CA.

* cited by examiner

Primary Examiner—Son T. Dinh
(74) Attorney, Agent, or Firm—Cynthia T. Faatz

(57) ABSTRACT

A pulsed circuit topology to perform a memory array write operation. A write enable pulse width control circuit is responsive to a pulsed clock signal to generate a pulsed write enable signal and a write data path circuit is provided to output a write data signal. The write enable pulse width control circuit and the write data path circuit together control a write operation to a memory cell.

24 Claims, 5 Drawing Sheets

PULSED CIRCUIT TOPOLOGY TO PERFORM A MEMORY ARRAY WRITE OPERATION

CROSS-REFERENCE TO RELATED APPLICATIONS

This application is related to copending U.S. patent applications Ser. No. 09/608,857, entitled, "Pulsed Circuit Topology Including a Pulsed, Domino, Flip-Flop," Ser. No. 09/608,389, entitled, "A Global Clock Self-Timed Circuit with Self-Terminating Precharge for High Frequency Applications," and Ser. No. 09/608,638, entitled, "Reset First Latching Mechanism for Pulsed Circuit Topologies," each of which is concurrently filed herewith.

BACKGROUND

1. Field

An embodiment of the present invention relates to the field of high frequency integrated circuits and, more particularly, to high frequency integrated circuits used to perform memory array write operations.

2. Discussion of Related Art

Advances in semiconductor manufacturing technologies have enabled circuit designers to continue to integrate more transistors on a single die. At the same time, computer architecture, and more specifically, processor architecture, continues to focus on shorter and shorter cycle times.

As clock speeds continue to increase (and thus, cycle times continue to decrease) and/or where certain parts of a chip operate at a higher frequency, limitations of conventional logic circuits may prevent such circuits from operating properly at the higher clock speeds. Further, many conventional logic circuits operate using a two-phase clock. For very high operating frequencies, it may not be feasible to generate and distribute a two-phase clock due to noise, clock jitter and/or other issues.

Where a pulsed clock is used instead of a conventional two-phase clock, the logic may be more susceptible to functional errors due to race conditions making such circuits more difficult for design engineers to work with.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A pulsed circuit topology that may be used to perform a memory array write operation is described. In the following description, particular types of integrated circuits and integrated circuit configurations are described for purposes of illustration. It will be appreciated, however, that other embodiments are applicable to other types of integrated circuits and to integrated circuits configured in another manner.

For one embodiment, a write enable pulse width control circuit is responsive to a pulsed clock signal to control the width of a write enable pulse. The write enable pulse width control circuit, together with a write data path circuit that is also coupled to receive the pulsed clock signal, controls a write operation to a memory cell.

Using the pulsed circuit topology of one embodiment to perform memory array write operations, double frequency or other high frequency memory array write operations may be enabled.

Figure 1:
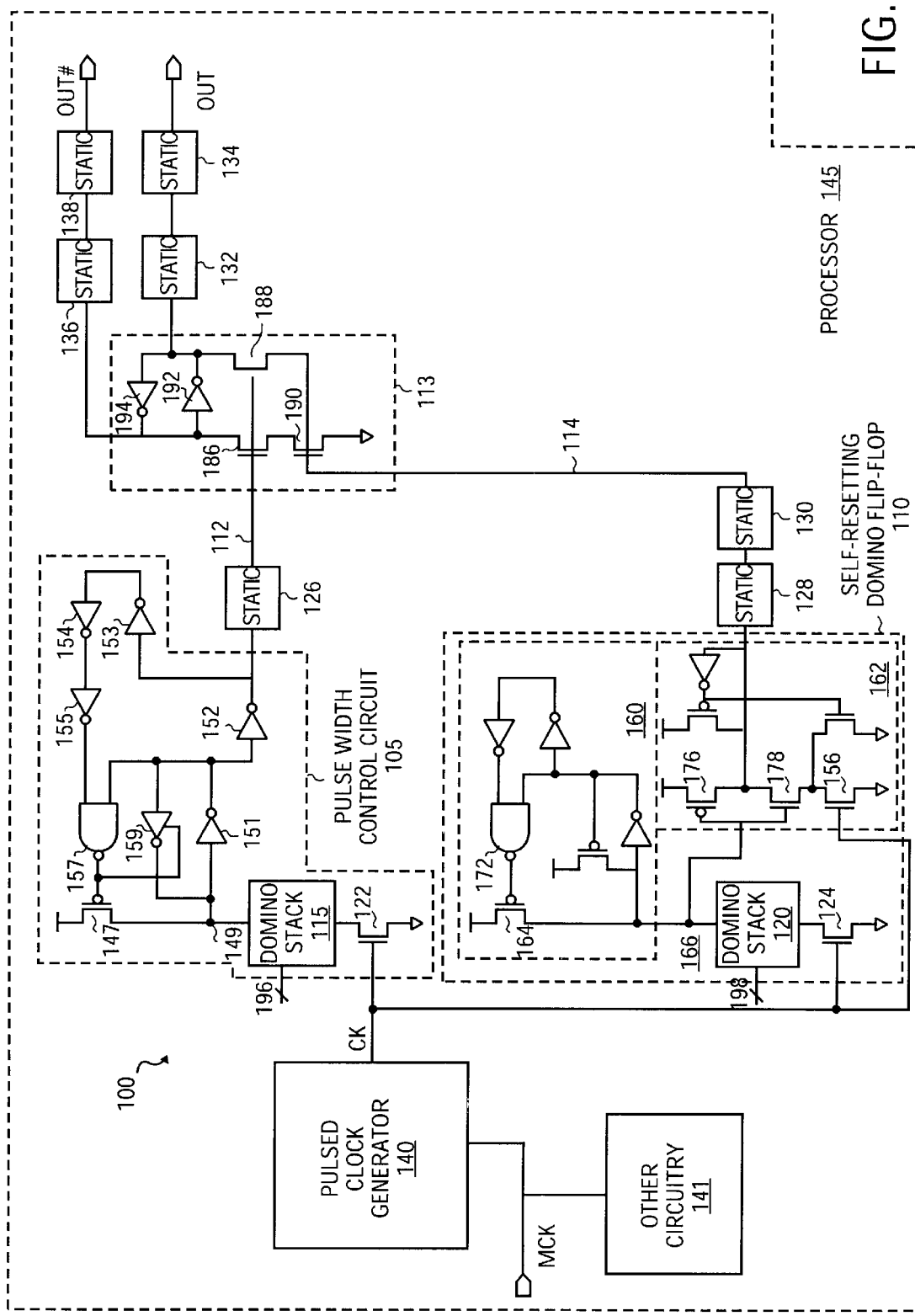
FIG. 1 is a schematic diagram of the pulsed circuit topology of one embodiment including a first type of redundant latch.

FIG. 1 is a schematic diagram of a pulsed array write circuit 100 of one embodiment. The pulsed array write circuit 100 includes a write enable (WE) pulse width control circuit 105 and a self-resetting domino flip-flop 110. The pulse width control circuit 105 is in a write enable (row) path 112 to a memory 113 and the pulsed, self-resetting domino flip-flop 110 is in a write data (column) path 114 to the memory 113. (Only one cell of the memory 113 is shown in FIG. 1). The write enable path 112 (also referred to more generally as a write enable circuit) includes all circuitry between the pulsed clock generator and the memory cell 113 on the circuit path that includes the pulse width control circuit 105. The write data path 114 (also referred to herein as a write data circuit) includes all circuitry between the pulsed clock generator and the memory cell 113 on the circuit path that includes the self-resetting domino flip-flop 110.

The pulsed array write circuit 100 may also include static logic stages 126, 128 and 130. Additional static logic stages 132 and 134, and 136 and 138 may be provided in output and inverted output paths, respectively, from the memory 113. The static logic stages of one embodiment may comprise, for example, inverters or complex logic gates. It will be appreciated that a different number and/or type of static logic stages may be included for other embodiments.

A pulsed clock generator 140 may be coupled to the circuit 100 to provide a pulsed clock signal (Ck) to circuitry in the write enable and write data paths 112 and 114. For one embodiment, the pulsed clock signal Ck is generated from a two-phase input clock signal MCk that may be used to clock other surrounding circuitry 141. Also, for one embodiment, the frequency of the pulsed clock signal Ck is twice that of the input clock signal MCk (i.e. there are two pulses of the Ck signal for each cycle of the MCk signal) such that the circuit 100 is a double frequency pulsed circuit. Examples of circuits that may be used to provide the pulsed clock generator 140 are described in U.S. Pat. No. 6,023,182 to Milshtein et al. entitled, "High Gain Pulse Generator," issued Feb. 8, 2000 and in U.S. Pat. No. 6,204,714 entitled "Variable Width Pulse Generator," filed on Sep. 24, 1998, issued Mar. 20, 2001, both of which are assigned to the assignee of the present invention. For other embodiments, a different type of clock generator that provides a pulsed clock signal may be used to implement the pulsed clock generator 140. Also, for other embodiments, separate pulsed clock generators may be used to clock each of the write enable and write data paths 112 and 114 independently. Further, the pulsed clock signal may provide a pulsed clock signal having a frequency that is the same as or a different multiple of the input clock signal frequency.

For one embodiment, the pulsed array write circuit 100 is provided on a processor 145, the memory cell 110 is one cell of a register file, and the input clock signal MCk to the pulsed clock generator 140 is a processor clock signal. For other embodiments, the pulsed array write circuit 100 may be provided on a different type of integrated circuit device, the input clock signal may be a different type of clock signal and/or the memory cell 110 may be part of a different type of memory.

With continuing reference to FIG. 1, the pulse width control circuit 105 of one embodiment includes a p-type reset (or precharge) transistor 147 having one terminal coupled to a power supply and another terminal coupled to a domino output node 149 at an output of n-type domino logic (also referred to herein as a domino stack) 115. Also coupled to the domino output node 149 is a series of five inverters 151–155. An output of the first inverter 151 is coupled to one input of a NAND gate 157 while the other input of the NAND gate 157 is coupled to an output of the fifth inverter 155. An output of the NAND gate 157 is coupled to the gate of the reset device 147 to control its operation.

Also included in the pulse width control circuit 105 is an n-interrupted keeper 159 having an input coupled to the output of the inverter 151, an output coupled to the input of the inverter 151 and the domino node 149, and a control input coupled to the output of the NAND gate 157. As described in more detail below, the n-interrupted keeper 159 operates during a write enable pulse. As represented in FIG. 1, the circuitry within the pulse width control circuit 105 above the domino stack 115 may be referred to herein as an atomic reset circuit, loop or stage.

The self-resetting domino flip-flop 110 of one embodiment includes a domino stack 120, an atomic reset circuit 160 and a set dominant latch 162 that, in the circuit 100, operates as a redundant latch. The self-resetting domino flip-flop 110 of the embodiment shown in FIG. 1 is similar in configuration and operation to the self-resetting domino flip-flop described in copending U.S. patent application Ser. No. 09/608,857, entitled, "Pulsed Circuit Topology Including a Pulsed, Domino Flip-Flop," filed concurrently herewith and assigned to the assignee of the present invention. For other embodiments, a different type of pulsed domino flip-flop circuit may be used.

The n-type domino logic circuits 115 and 120 may be any type of domino logic gate that implements any one of a variety of logic functions. The n-type domino logic circuit 115 may, for example, perform a NAND or other type of logic function according to one or more control signals received at input(s) 196 to determine when a write enable signal is to be asserted. The corresponding logical output is provided at the domino output node 149 during an evaluate pulse as described in more detail below. The n-type domino logic circuit 120 may, for example, perform a particular logic function responsive to input data received at input(s) 198 to determine the data to be written to the memory cell 113.

The memory cell 113 of one embodiment includes two NFET enable transistors 186 and 188, an NFET data transistor 190 and a keeper formed by series-coupled inverters 192 and 194. The inverter 192 has an input coupled to one terminal of the enable device 186 to an output of the inverter 194. The inverter 192 has an output coupled to one terminal of the enable device 188 and to an input of the inverter 194. Static logic stages 132 and 134 are coupled in series to the output of the inverter 192 to provide a true output signal OUT while static logic stages 136 and 138 are coupled to an output of the inverter 194 to provide a complementary (inverted) output signal OUT#. Either or both of the OUT and OUT# outputs may be received by subsequent circuitry (not shown). It will be appreciated that, for alternative embodiments, other types of memory cells (including, for example, other types of single-ended cells, dual-ended and/or multi-ported cells) configured in a different manner may also benefit from the pulsed array write circuit and/or technique of various embodiments.

Further, while only one memory cell is shown in FIG. 1, it will be appreciated that the memory 113 may include an array of similar memory cells that may be arranged in rows and columns. For such an array, the write enable (row) path including the pulse width control circuit 105 is replicated for each row of the memory array and the data (column) path including the self-resetting domino flip-flop 110 is replicated for each column of the memory array.

In operation, referring first to the write enable path 112 including the pulse width control circuit 105, during a reset (or precharge) pulse, the domino node 149 is precharged to a logic high level by the precharge device 147. During a subsequent evaluate pulse, depending on the data received at the data input(s) 196 and the logical function performed by the domino logic 115, the domino node 149 may be discharged to a logic low level to provide a write enable pulse. Alternatively, the domino node 149 may remain at the precharged logic high level such that a write enable pulse is not provided to the memory cell 113. The timing of the precharge (reset) and evaluate pulses is controlled by the pulse width control circuit 105 as described in more detail below.

After a reset pulse, on a rising edge of the Ck pulse, an evaluate device 122 is turned on such that a path to ground is provided for the domino logic 115. Assuming the domino node 149 was previously precharged high, and data at the n-type domino logic input(s) 196 causes the domino logic 115 to evaluate low, the domino node 149 begins to discharge to a logic low level.

Also at the end of a reset pulse, the output of the NAND gate 157 transitions to a high level to disable the reset device 147 as described in more detail below. As the output of the NAND gate 157 transitions to a high level, the n-type device of the n-interrupted keeper 159 is enabled. (The n-interrupted keeper 159 includes a weak p-type device that is always enabled.) When the n-type device of the n-interrupted keeper 159 is enabled, the keeper 159 acts with the inverter 151 to help maintain valid data (either a logic high or logic low level) at the domino node 149 for a longer period of time.

As the domino node 149 discharges, an output of the first inverter 151 of the pulse width control circuit 105 begins to rise causing a logic high value at one input to the NAND gate 157. The other input to the NAND gate 157, however, is still at a logic low level at this time based on the precharged high level of the domino node 149. As the output of the inverter 151 transitions to a logic high value, the output of the inverter 152 falls one inversion (unit delay) later. Assuming the static logic gate 126 is an inverting gate, the signal at the gates of the write enable transistors 186 and 188 of the memory cell 113 transitions to a high value. In this manner, the write enable devices 186 and 188 are turned on such that data at the gate of the transistor 190 (from the write data path 114) may be written to the memory cell 113 during the write enable pulse.

Referring back to the pulse width control circuit 105, the falling output of the inverter 152 causes the output of the inverter 153 to rise. The output of the fourth inverter 154 then falls and the output of the fifth inverter 155 then rises, each transition occurring inversion later than the transition of the previous inverter output. The rising output of the fifth inverter 155 causes the second input to the NAND gate 157 to transition to a logic high value four inversions later than the transition of the first input to the NAND gate 157. When both inputs to the NAND gate 157 are high, the output of the NAND gate 157 transitions to a logic low value such that the precharge device 147 is turned on and the n-side of the keeper 159 is disabled. Turning on the precharge device 147 initiates a reset pulse during which the domino node 149 is again pulled to a logic high value.

In this manner, the operation of the pulse width control circuit 105 determines the width (i.e. length) of a write enable pulse. As described above, for the write enable pulse width control circuit 105, the delay from the time the domino node 149 discharges to a low enough level to cause a logic transition to the time the domino node 149 begins to be precharged is substantially equal to seven inversions. Thus, the write enable pulse width is substantially equal to seven inversions.

Once the reset pulse is initiated, as the domino node 149 is pulled high, the output of the inverter 151 falls and causes one input to the NAND gate 157 to fall. As the input to the NAND gate 157 goes low, its output rises such that the precharge device 135 is disabled, thereby ending the reset pulse. In this manner, the reset pulse is clipped by the NAND gate 157 to have a pulse width substantially equal to 3 inversions: one gate delay through the inverter 151, one gate delay through the NAND gate 157 and one gate delay due to the reset device 147.

Using the pulse width control circuit 105, predictable reset and write enable pulse widths are enabled for each cycle of the pulsed clock Ck. Further, using the pulse width control circuit 105, the write enable pulse width can be substantially equal to seven inversions such that sufficient time is provided to write to the memory cell 113.

Figure 2:
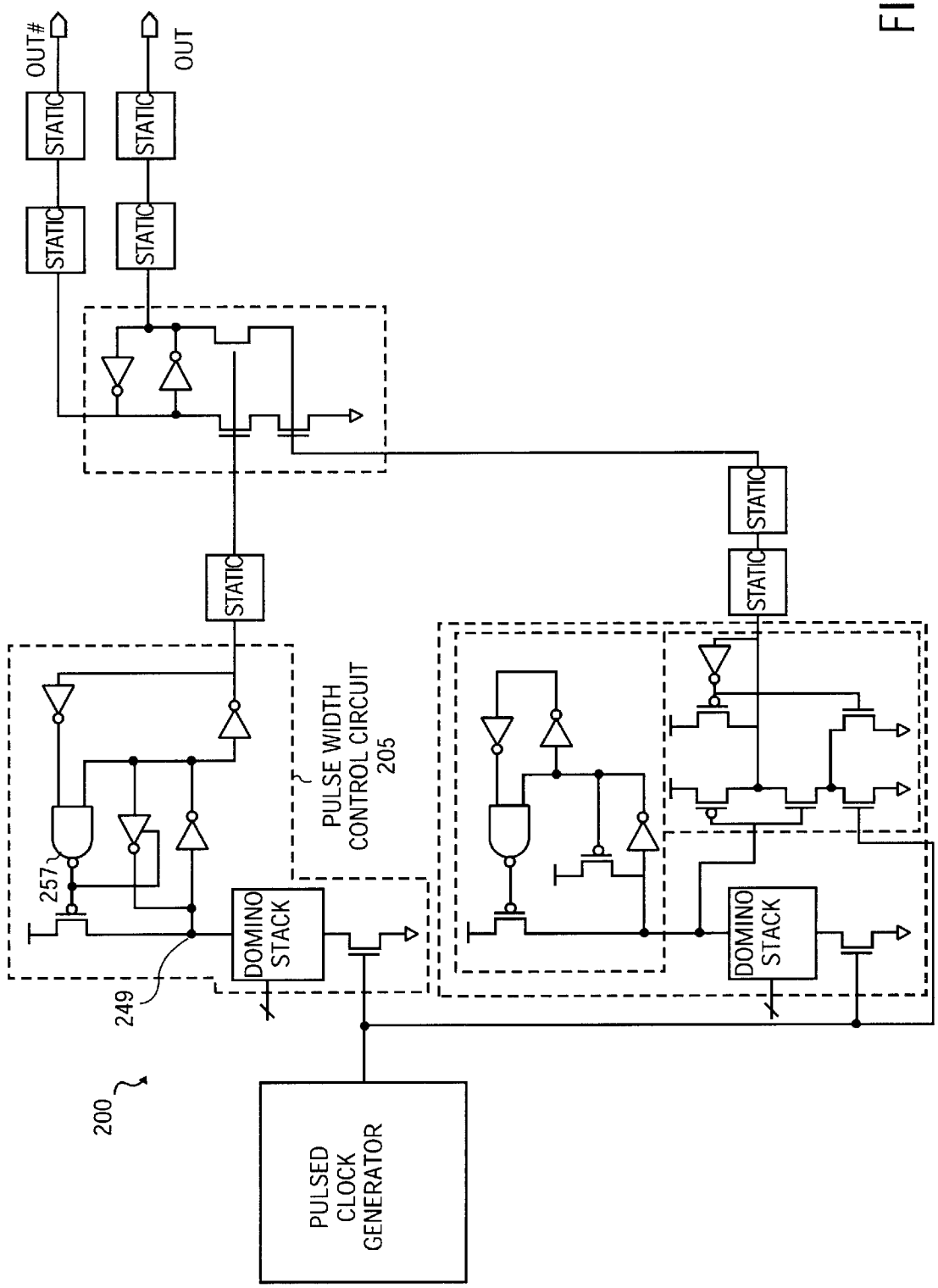
FIG. 2 is a schematic diagram of the pulsed circuit topology of another embodiment having a shorter evaluate pulse.

Using the circuit 100, however, it may not be possible to write to the same row of the memory 113 on successive cycles for certain frequencies because there may not be enough time for the write enable domino stage 105 to reset. Where it is desirable to be able to write to the same row of memory on successive cycles, the write enable pulse can be shortened to, for example, 5 inversions. FIG. 2 is a schematic diagram of a circuit 200 embodying the pulsed circuit topology of another embodiment in which a 5-inversion write enable pulse is provided. The circuit 200 of FIG. 2 is identical in most respects to the circuit 100 of FIG. 1. The pulse width control circuit 205, however, includes two less inverters than the pulse width control circuit 105. The inverters are removed from the path between the domino node 249 and one input of the NAND gate 257 such that the write enable pulse controlled by the pulse width control circuit 205 is two inversions narrower. In this manner, the circuit 200 may provide for successive write operations to the same row, but with less margin in terms of resolution of the memory cell 113.

Referring back to FIG. 1, for other embodiments, other wider or narrower write enable pulse widths may be provided by the pulse width control circuit by varying its configuration. Wider pulse widths, for example, may provide additional race margin and cell resolution time for lower frequency operation. Further, for some embodiments, one or more of the inverters 151 and/or 154 may be replaced with other static or domino logic that is guaranteed to fire if an input is asserted (e.g. an OR gate, etc.). Similarly, the static stage 126 may be replaced with domino logic for some embodiments. Also, the n-interrupted keeper 159 may be replaced with a jam latch or a p-keeper, for example.

Reference is now made to the write data path 114 of the circuit 100 including the self-resetting domino flip-flop 110 that operates as a redundant latch. Similar to the write enable path 112, a domino node 166 is precharged to a logic high level by a precharge device 164. The precharge device is controlled by the atomic reset loop 160. During a subsequent evaluate phase, depending on the data received at data input(s) 198 and the logical function performed by the domino logic 120, the domino node 166 may be discharged to a logic low level or it may remain at the precharged logic high voltage level. The timing of the precharge and data pulses in the write data path is determined, at least in part, by the atomic reset stage 160.

On a rising edge of the Ck pulse, an evaluate device 124 is turned on such that a path to ground is provided for the domino logic 120. As described in the above-referenced copending U.S. patent application, entitled "Pulsed Circuit Topology Including a Pulsed Domino Flip-Flop," for the flip-flop 110, from the time the domino node 166 discharges to a low enough level to cause a logic transition to the time the domino node 166 begins to be pulled high in response to a reset pulse is substantially equal to five inversions (also referred to as unit delays or gate delays). As also described, a reset pulse is initiated by the atomic reset loop 160. The reset pulse is clipped by a NAND gate 172 to have a pulse width substantially equal to 3 inversions. Thus, using the atomic reset loop 160, predictable reset and evaluate pulses are enabled for each cycle of the pulsed clock signal Ck.

Additional details of an atomic reset loop similar to the atomic reset loop 160 and other examples of atomic reset loops that may be used for other embodiments are provided in U.S. Pat. No. 6,239,621 entitled "Two Legged Reset Controller for Domino Circuit", issued May 29, 2001, and assigned to the assignee of the present invention. For other embodiments, other types of reset control circuitry may be used.

Concurrently with the above operations, the set dominant latch 162 portion of the pulsed domino flip-flop 110 is activated by a rising edge of a Ck signal pulse at a pulldown device 186. In this manner, a reset of the pulsed domino flip-flop 110 is triggered for each cycle of the clock signal Ck. The latch 162 redundantly latches an inverse of a value indicated by the domino logic 120 during an evaluate pulse, thereby sustaining a data signal that is rippled as a static signal through the static logic stages 128 and 130 to the gate of the data transistor 190. The data indicated by the data pulse can then be written to the memory cell 113 during an overlapping write enable pulse described above.

Use of the flip-flop 110 may ensure that data to be written to the memory cell 113 remains valid for a longer time and thus, the pulsed memory write circuit 100 may be more robust. Further, the flip-flop 110 provides a static output signal in response to a pulsed input signal.

Figure 3:
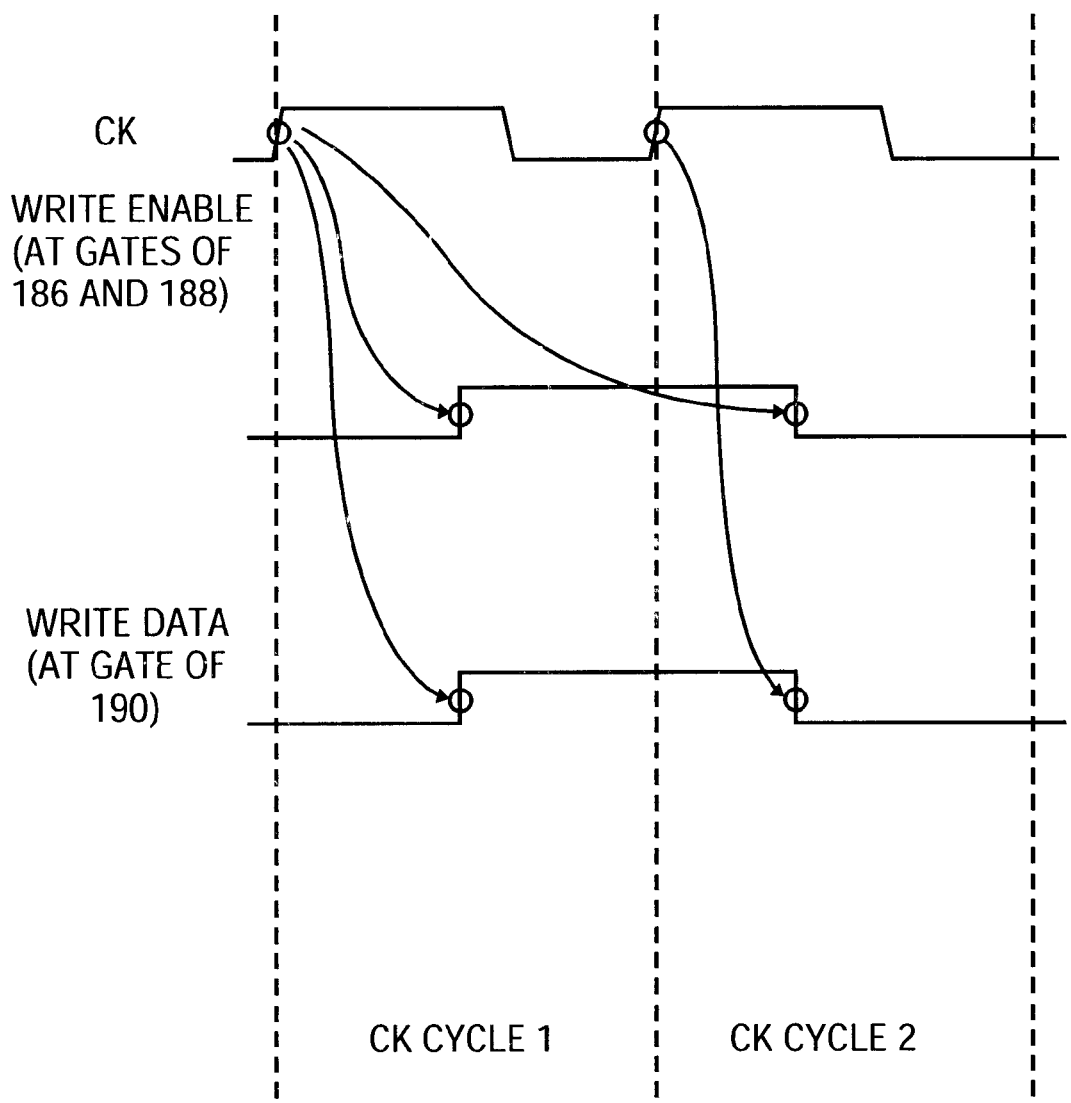
FIG. 3 is a timing diagram illustrating the timing relationships between some signals that may be communicated by the circuit of FIG. 1.

FIG. 3 is a timing diagram showing an example of the timing relationships between various signals communicated by the circuit 100 of FIG. 1 for one embodiment. As shown in FIG. 3, from the time a rising edge of a Ck signal is received at the evaluate device 122 to the time a write enable pulse rising edge is received at the gate of the write enable transistors 186 and 188 is substantially equal to four inversions (one gate delay due to each of the device 122, the inverters 151 and 152 and the static stage 126). As described above, for the embodiment of FIG. 1, the write enable pulse width is substantially equal to seven inversions.

Also as shown in FIG. 3, from the time a rising edge of a Ck signal is received at the evaluate device 124 to the time a responsive high going data pulse is received at the gate of the transistor 190 is substantially equal to four inversions (one gate delay due to each of the devices 124 and 176 and the static stages 128 and 130). A low going data pulse, however, is received at the gate of the transistor 190 in about three inversions (one gate delay due to each of the device 178 and the static stages 128 and 130) as shown in FIG. 3 due to the configuration and operation of the pulsed domino flip-flop 110 of FIG. 1. Thus, as shown, the circuit topology 100 provides sufficient overlap between write enable and write data pulses such that data may be written to the memory cell 113.

Referring back to FIG. 1, for some embodiments, a different type of circuit may be used to redundantly latch data or a redundant latch may not be provided as described below with reference to FIGS. 4 and 5. For example, other types of latches or flip-flops, including other types of domino flip-flops, may be used for some embodiments. The flip-flop 110, however, has some desirable characteristics that may indicate its use in particular designs as described in the copending patent application mentioned above entitled, "Pulsed Circuit Topology Including a Pulsed, Domino Flip-Flop."

Figure 4:
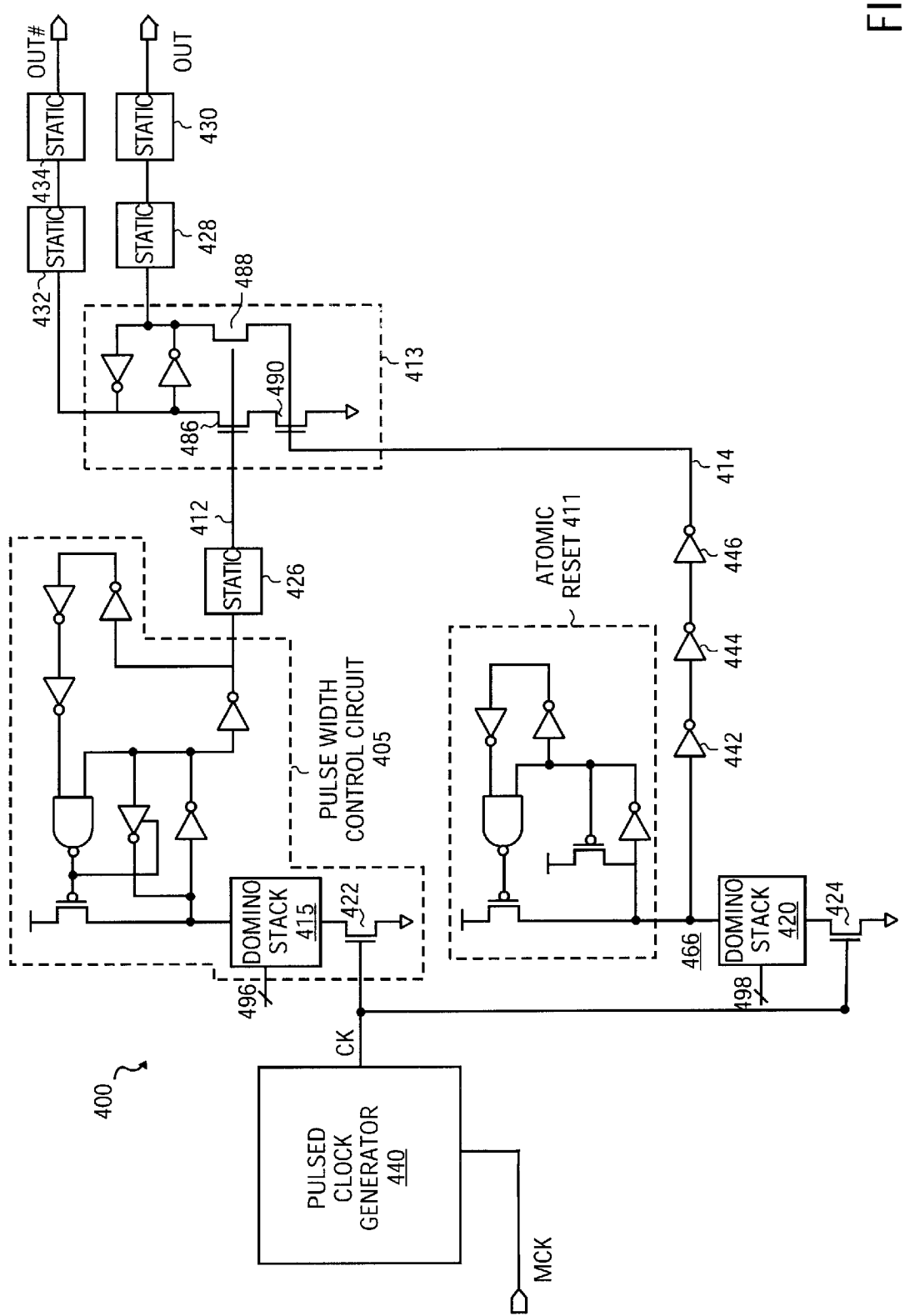
FIG. 4 is a schematic diagram of the pulsed circuit topology of another embodiment without a redundant latch.

FIG. 4 is a schematic diagram of a circuit 400 illustrating another embodiment of the pulsed circuit topology for performing a memory array write operation. For the embodiment of FIG. 4, the write data signal is also a pulsed signal. The circuit 400 includes a write enable pulse width control circuit 405 and an atomic reset circuit 411, each similar in configuration and operation to similarly labeled circuits of FIG. 1. The pulse width control circuit 405 is in a write enable (row) path 412 to a memory 413 and the atomic reset circuit 411 is part of a write data (column) path 414 to the memory 413. (Only one cell of the memory 413 is shown in FIG. 4).

The pulsed array write circuit 400 may also include n-type domino logic 420, evaluate device 424 and static logic stages 426, 428, 430, 432 and 434. The static logic stages may comprise, for example, inverters or inverting complex logic gates. It will be appreciated that a different number and/or type of static logic stages may be included for other embodiments.

A pulsed clock generator 440 may be coupled to the circuit 400 to provide a pulsed clock signal (Ck) to circuitry in the write enable and/or write data paths 412 and 414. For one embodiment, the pulsed clock signal Ck is generated from a two-phase input clock signal MCk that may be used to clock other surrounding circuitry (not shown) as described above. For other embodiments, separate pulsed clock generators may provide pulsed clock signals to each of the write enable and write data paths.

Additionally, the circuit 400 includes three series-coupled inverters 442, 444 and 446 in the write data path 414. As described in more detail below, the inverters 442, 444 and 446 help to match the delay of the write data path 414 to the delay of the write enable path 412. In this manner, timing of a data pulse may be more easily coordinated to overlap with a write enable pulse. For other embodiments, one or more of the inverters 412–414 may be replaced with a different type of static logic gate or a domino gate that is guaranteed to fire when an input is asserted (e.g. an OR gate). Further, the atomic reset loop 411 may be coupled in a different manner such that one or more of the logic gates 412–414 is in the input path to the NAND gate in the circuit 411 to control the reset pulse (this is referred to as an interlocked configuration).

In operation, the circuitry in the write enable path 412 operates in the same manner as the corresponding circuitry in the write enable path 112 of FIG. 1 to provide, and control the width of, a write enable pulse.

Referring to the write data path 414, a domino node 466 is precharged to a logic high level as previously described. When the node 466 reaches a voltage level equivalent to a logic high level, three inversions later, the precharge pulse ends as described above. On a rising edge of a Ck signal pulse, the evaluate device 424 is enabled. If input(s) 498 to the domino logic 420 are set appropriately such that the domino logic 420 evaluates low, three inversions later, a low write data pulse arrives at the gate of the write data transistor 490 of the memory cell 413.

If the inputs 496 to the domino logic 415 in the write enable path are set appropriately, on the rising edge of the same Ck signal pulse, the domino logic 415 also evaluates low. Three inversions later, a write enable pulse then arrives at the gates of write enable transistors 486 and 488 of the memory cell 413 such that a memory write operation is enabled. In this manner, the write enable pulse overlaps with the write data pulse such that valid data (a logical high value or "1" in this example) is written to the memory 413. The atomic reset circuit 411 then operates in the manner described above to again precharge the domino node 466 to a logic high level.

If, instead, the input(s) 498 to the domino logic 420 are set such that the domino node 466 is not discharged, assuming a coincident write enable pulse, a logical low value or "0" is written to the memory 413.

Under certain circumstances, because both the write enable path 412 and the write data path 414 of the circuit 400 are self-timed from the rising edge of the Ck signal pulse, due to variability in signal delay times due to pattern dependence of logic stages, it is possible that sufficient overlap between the write enable pulse and the data pulse may not be provided. To reduce the likelihood of such an issue, a global reset circuit that coordinates the trailing edges of both the write enable and write data pulses may be included.

Figure 5:
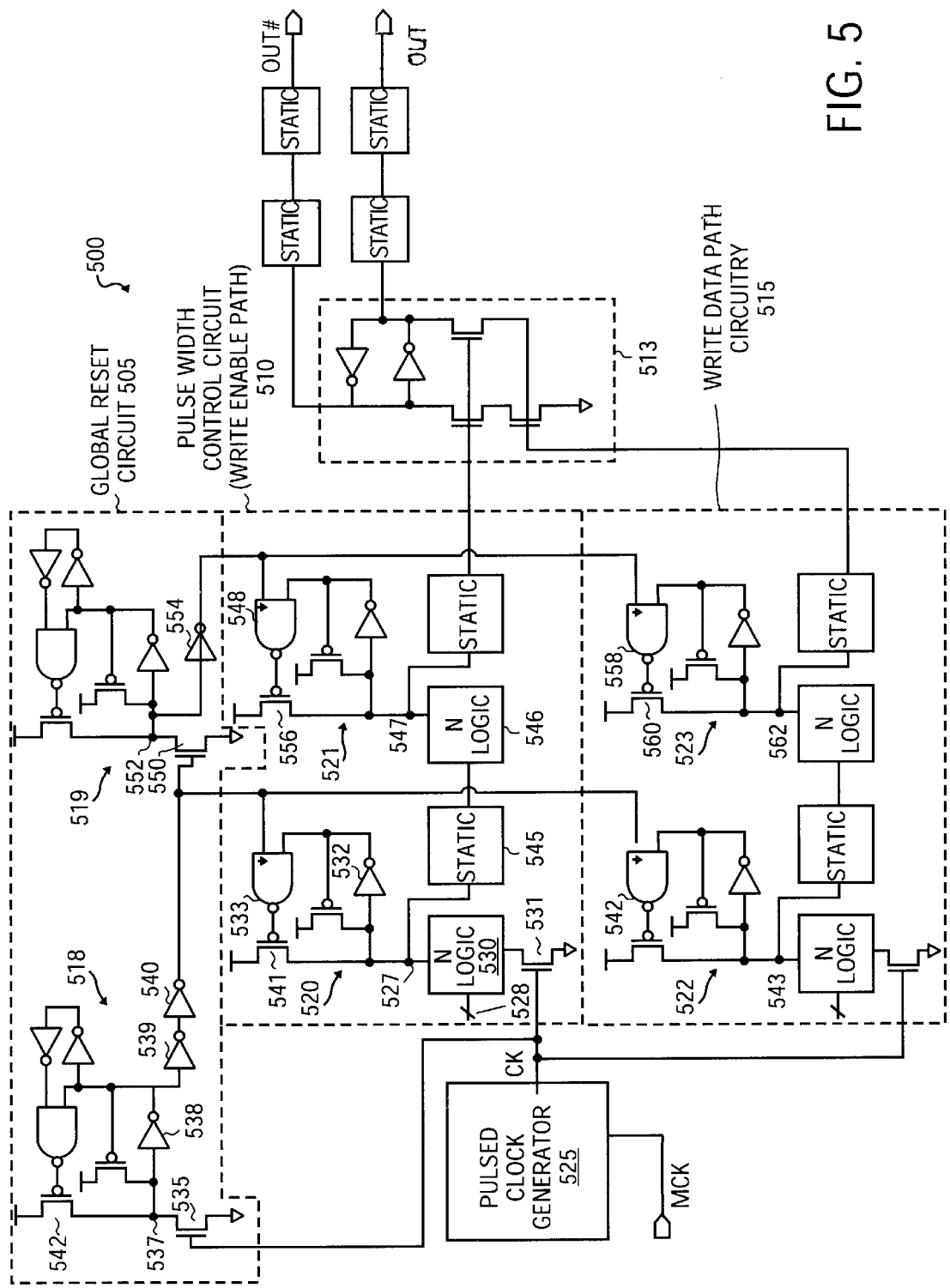
FIG. 5 is a schematic diagram of the pulsed circuit topology of another embodiment without a redundant latch that includes global reset circuitry.

FIG. 5 is a schematic diagram of the pulsed circuit topology of one embodiment including such global reset circuitry. The circuit 500 of FIG. 5 includes a global reset circuit 505, a pulse width control circuit 510 in the write enable path to the memory cell 513, and write data path circuitry 515.

Each of the global reset circuit 505, the pulse width control circuit 510 and the write data path circuitry 515 of this embodiment includes two self-terminating precharge stages 518 and 519, 520 and 521, and 522 and 523, respectively. The individual self-terminating precharge circuits 518-523 each locally self-terminate a reset pulse that is globally initiated by the global reset circuit 505 as described in more detail below.

For some embodiments, one or more of the static logic stages is implemented using ratioed logic in accordance with the teachings of U.S. Pat. No. 5,942,917 to Chappell et al., entitled, "High Speed Ratioed CMOS Logic Structures for a Pulsed Environment," issued Aug. 24, 1999 and assigned to the assignee of the present invention.

In operation, a rising edge of the pulsed clock signal Ck from a pulsed clock generator 525 is concurrently received at the global reset circuit 505, the pulse width control circuit 510 and the write data path circuitry 515 as shown. Referring first to the pulse width control circuit 510, assuming a domino node 527 was previously precharged high and inputs 528 to a domino stack 530 are set appropriately, the rising edge of the Ck pulse received at an evaluate device 531 causes the domino node 527 to be pulled low. An output of an inverter 532 transitions to a high logic state one inversion later such that one input to a NAND gate 533 goes high two inversions after the rising edge of the Ck pulse is received at the evaluate device 531.

The other input to the NAND gate 533 is received from the global reset circuit 505. At the global reset circuit 505, the rising edge of the same Ck pulse is received at the transistor 535 and causes it to conduct thereby pulling the node 537 low. Three inversions later, an output of a series of inverters 538–540 transitions to a high logic level which is received at the other input of the NAND gate 533 in the pulse width control circuit 510. At this point, an output of the NAND gate transitions to a logic low state to enable a precharge device 541 in the self-terminating precharge stage 520 to initiate a reset or precharge pulse.

The self-terminating precharge stage 522 in the write data path circuitry 515 is configured and operates in a similar manner to the self-terminating precharge stage 520, also receiving one input to a NAND gate 542 from the global reset circuit 505. In the above manner, the self-terminating precharge stage 522 concurrently initiates a reset pulse in response to the global reset circuit 505 to precharge a local domino node 543.

Thus, six inversions after the rising edge of a Ck pulse is received at the global reset circuit 505 (five inversions after the domino nodes 537 and 527 evaluate), write enable and write data pulses are terminated and precharge pulses are concurrently initiated at the domino nodes 527 and 543.

The transition of the domino node 527 from a precharged high level to a low level in response to the rising edge of the Ck signal is also rippled through a static stage 545 (which may be an inverter or complex inverting gate, for example) to a second n-type domino stack 546 which may simply perform an inverting logic function, for example. In response, a domino node 547 is pulled low two inversions after the domino node 527 is pulled low. One inversion later, one input of a NAND gate 548 transitions to a logic high state. The other input to the NAND gate 548 is received from the global reset circuit 505.

The output of the inverter 540 in the global reset circuit 505 that is coupled to one input of the NAND gate 533 is also coupled to a gate of a transistor 550. As the output of the inverter 540 transitions to a high level, the transistor 550 is enabled such that a domino node 552 is pulled low. One inversion later, an output of an inverter 554 transitions to a logic high level to provide the other input to the NAND gate 548.

In the above manner, both inputs to the NAND gate 548 are at a logic high level approximately six inversions after the rising edge of a Ck signal pulse is received at the gates of the transistors 528 and 535. As a result, the output of the NAND gate 548 (and a corresponding NAND gate 558 in the write data path circuitry 515) transitions to a low logic level to enable a precharge transistor 556 (and a corresponding precharge transistor 560 in the write data path circuitry 515). In this manner, a local precharge pulse is globally initiated at each of the self-terminating precharge stages 521 and 523 by the global reset circuit 505.

The reset domino input pulses that are globally initiated by the global reset circuit 505 are locally terminated by each of the self-terminating precharge circuits 520–523. For one embodiment, this local termination of the precharge pulse happens only after the corresponding domino nodes 527, 547 543 and 562 have been fully precharged following an evaluate pulse.

To avoid terminating a precharge pulse before the corresponding domino node has been fully precharged, the inputs to each of the NAND gates 533, 548, 542 and 558 of one embodiment that are coupled to the global reset circuit 505 include a weak pull-up device (indicated by the arrow at one input to the NAND gates). In this manner, the outputs of each of the NAND gates 533, 548, 542 and 558 are not switched to a logic high level by a transition of corresponding global reset circuit 505 input alone within the time period of interest. A transition of the remaining inputs to each of the NAND gates 533, 548, 542 and 558 is also needed to cause the outputs to transition from a logic low level where the corresponding precharge devices are enabled to a logic high level that terminates the precharge pulse.

For purposes of illustration, the manner in which a precharge pulse is terminated locally is described in reference to the self-terminating precharge circuit 520. It will be appreciated that the self-terminating precharge circuits 521–523 operate in a similar manner to locally terminate corresponding precharge pulses.

In operation, a precharge pulse is globally initiated in the manner described above. Once the domino node 527 has been fully precharged, one inversion later, an output of the inverter 532 (and thus, an input to the NAND gate 533, transitions to a logic low level. This transition causes the output of the NAND gate 533 to transition to a logic high level thereby disabling the precharge device 541 to self-terminate the precharge pulse initiated by the global reset circuit 505 and to prepare the circuit for the next evaluation pulse. Thus, three inversions after the domino node 527 has been precharged, the reset input pulse is terminated.

The pulse width control circuit 510 and the write data path circuitry 515 operate in the above-described manner to control write enable and data devices, respectively in the memory cell 513 such that the memory cell may be written as described above in reference to FIGS. 1–4. The global reset circuit 505, due to the manner in which it globally initiates precharge pulses, helps to tie the trailing edges of write enable and write data signals together such that sufficient overlap between these signals is provided to enable a memory write operation.

The global reset circuitry of FIG. 5 and other embodiments is described in more detail in a copending U.S. patent application, Ser. No. 09/608,389, entitled "A Global Clock Self-Timed Circuit with Self-Terminating Precharge for High Frequency Applications," filed concurrently herewith and assigned to the assignee of the present invention.

For other embodiments, the global reset circuit may be implemented in another manner. For example, a chain of series-coupled inverters may instead by used and/or a larger or smaller number of global reset circuitry stages may be used. Also, for other embodiments, the domino logic of the pulse width control circuit 510 and/or the write data path circuitry 515 may be zipper domino logic (i.e. alternating n-type and p-type domino logic). For such embodiments, one or more of the self-terminating precharge stages may be implemented using complementary logic. Further, a different number of logic stages, self-terminating precharge stages, etc. may be used so long as the resulting circuit operates in response to a pulsed clock signal to enable a memory array write operation wherein the memory may be, for example, a register file. For other embodiments, the memory cell may be located in a different stage of the circuit.

Additionally, while the write enable path of the illustrated embodiments is shown as including an interlocked configuration for the reset circuitry (i.e. logic output signals from inverters are involved with the reset loop), for other embodiments, the reset circuitry of the write enable path may be non-interlocked. For such an embodiment, one or more of the inverters in the reset circuitry and/or one or more other types of logic stages may be provided outside the reset loop, but in the write enable path.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, complementary logic may be used for some embodiments. The specification and drawings are, accordingly, to be regarded in an illustrative rather than a restrictive sense.

What is claimed is:

1. An apparatus comprising:
  a write enable pulse width control circuit that is responsive to a pulsed clock signal to generate a pulsed write enable signal; and
  a write data path circuit to output a write data signal,
  the write enable pulse width control circuit and the write data path circuit to control a write operation to a memory cell, the write enable pulse width control circuit further to control the pulsed write enable signal such that a write enable pulse portion of the write enable signal is wider than a reset pulse portion of the write enable signal.

2. The apparatus of claim 1 wherein the write enable pulse width is substantially equivalent to 7 inversions and the reset pulse width is substantially equivalent to 3 inversions.

3. The apparatus of claim 1 wherein the write data signal is a pulsed signal.

4. The apparatus of claim 1 wherein the write data path circuit includes a redundant latch to latch data to be written to the memory cell.

5. The apparatus of claim 4 wherein the redundant latch is a pulsed, domino flip-flop.

6. The apparatus of claim 1 wherein the memory cell is included in a register file.

7. The apparatus of claim 1 wherein the pulsed clock signal is at least twice the frequency of another clock signal used to clock other circuitry on an integrated circuit that includes the write enable pulse width control circuit and the write data path circuit.

8. An apparatus comprising:
  a write enable pulse width control circuit that is responsive to a pulsed clock signal to generate a pulsed write enable signal; and
  a write data path circuit to output a write data signal,
  the write enable pulse width control circuit and the write data path circuit to control a write operation to a memory cell,
  at least one of the write enable pulse width control circuit and the write data path circuit comprises an atomic reset stage to locally initiate and locally terminate a reset pulse at a corresponding domino node.

9. The apparatus of claim 8 further comprising:
  global reset circuitry to control initiation of a reset pulse concurrently at domino nodes in each of the write enable pulse width control circuit and the write data path circuit such that the pulsed write enable signal and the write data signal overlap at the memory cell.

10. The apparatus of claim 9 wherein each of the write enable pulse width control circuit and the write data path circuit includes a self-terminating precharge stage to locally terminate the reset pulses initiated by the global reset circuit.

11. An integrated circuit device comprising:
  a first circuit to operate in response to a first clock signal at a first clock frequency; and
  a memory array write circuit to operate in response to a second clock signal at a second, higher clock frequency, the memory array write circuit comprising
    a pulsed write enable circuit to generate a write enable pulse, and a write data circuit to output a write data signal,
    the pulsed write enable circuit and the write data circuit together to control a memory write operation to a memory cell.

12. The integrated circuit device of claim 11 wherein the first clock signal is a two-phase clock signal and the second clock signal is a pulsed clock signal.

13. The integrated circuit device of claim 12 wherein the write data signal is a pulsed signal.

14. The integrated circuit device of claim 12 wherein the write data circuit includes a redundant latch to latch data to be written to the memory cell, the redundant latch being responsive to the second pulsed clock signal to provide a static write data signal.

15. The integrated circuit device of claim 11 wherein
  at least one of the pulsed write enable circuit and the write data circuit includes an atomic reset circuit to locally initiate and self-terminate a reset pulse at a corresponding domino node.

16. The integrated circuit device of claim 15 wherein the redundant latch comprises a pulsed, domino flip-flop.

17. The integrated circuit device of claim 15 wherein
  the write data circuit includes a pulsed, domino flip-flop to redundantly latch data to be written to the memory cell.

18. The integrated circuit device of claim 11 wherein the memory cell is included in a register file.

19. The integrated circuit device of claim 11 further comprising
  global reset circuitry to concurrently initiate reset pulses at domino nodes within each of the pulsed write enable circuit and the write data circuit;
  a first self-terminating precharge circuit to locally self-terminate the reset pulse at the domino node in the pulsed write enable circuit; and
  a second self-terminating precharge circuit to locally self-terminate the reset pulse the domino node in the write data circuit.

20. A method comprising:
  generating a pulsed write enable signal;
  generating a write data signal including redundantly latching data to be written to the memory cell; and
  writing to a memory cell in response to the pulsed write enable signal and the write data signal.

21. The method of claim 20 wherein generating the write data signal includes generating a pulsed write data signal.

22. The method of claim 20 wherein generating the write data signal further includes
  providing a static write data signal in response to a pulsed input signal.

23. The method of claim 20 wherein
  writing to a memory cell includes writing to a memory cell in a register file.

24. The method of claim 20 wherein
  generating a pulsed write enable signal and generating a write data signal both occur in response to a pulsed clock signal having a frequency that is higher than a frequency of a two-phase clock signal used to clock other surrounding circuitry.

* * * * *